(12) United States Patent
Takeuchi

(10) Patent No.: US 6,218,883 B1
(45) Date of Patent: Apr. 17, 2001

(54) SEMICONDUCTOR INTEGRATED CIRCUIT FOR ELECTRIC MICROPHONE

(75) Inventor: Takanobu Takeuchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/304,054

(22) Filed: May 4, 1999

(30) Foreign Application Priority Data

Nov. 19, 1998 (JP) .................................................. 10-329608

(51) Int. Cl.[7] ................................ H03K 5/08; H03L 5/00
(52) U.S. Cl. ......................... 327/318; 327/103; 327/309
(58) Field of Search ................................... 327/560, 563, 327/379, 318, 319, 320, 108, 103, 306, 307, 308, 309; 330/277; 381/120

(56) References Cited

U.S. PATENT DOCUMENTS

| | | | |
|---|---|---|---|
| 4,100,437 | * 7/1978 | Hoff, Jr. ................................ | 327/563 |
| 4,427,903 | * 1/1984 | Sugimoto .............................. | 327/103 |
| 5,061,861 | * 10/1991 | Sameshima et al. ................. | 327/108 |
| 5,107,144 | * 4/1992 | Hirayama ............................. | 326/83 |
| 5,576,737 | * 11/1996 | Isozaki ................................. | 345/211 |
| 5,642,308 | * 6/1997 | Yoshida ................................ | 327/185 |
| 5,744,984 | * 4/1998 | Drapac et al. ....................... | 327/108 |
| 5,764,467 | * 6/1998 | Seo ....................................... | 361/91 |
| 5,767,545 | * 6/1998 | Takahashi ............................ | 327/427 |
| 5,903,422 | * 5/1999 | Hosokawa ............................ | 327/427 |
| 6,014,054 | * 1/2000 | Kawakita et al. ................... | 327/563 |
| 6,137,360 | * 10/2000 | Memida ............................... | 330/253 |

FOREIGN PATENT DOCUMENTS 10-41757   2/1998  (JP) .

* cited by examiner

Primary Examiner—Terry D. Cunningham
Assistant Examiner—Long Nguyen
(74) Attorney, Agent, or Firm—Oblon, Spivak, McClelland, Maier & Neustadt, P.C.

(57) ABSTRACT

A semiconductor integrated circuit has an amplifier circuit for amplifying a voltage change accompanying a change in a capacitance of a capacitor in an electric microphone. The integrated circuit includes a voltage conversion circuit for voltage converting this voltage change; an amplifier for amplifying a voltage converted by the voltage conversion circuit; and a reference bias circuit for producing and outputting a reference bias voltage to the amplifier. The voltage conversion circuit operates so that the midpoint of the voltage change is a value approximately ½ the dc voltage supplied to the amplifier.

9 Claims, 4 Drawing Sheets ns (b) and (d) that $\Delta Vr=\Delta Vin$.

SEMICONDUCTOR INTEGRATED CIRCUIT FOR ELECTRIC MICROPHONE

BACKGROUND OF THE INVENTION

1. Field of the Invention

The present invention relates to a semiconductor integrated circuit comprising a voltage conversion circuit and a bias circuit for obtaining a voltage change from a change in the capacitance of a capacitor used in, for example, an electric microphone.

2. Description of Related Art

FIG. 7 is a circuit diagram of a voltage conversion circuit according to related art for obtaining a voltage change resulting from a change in the capacitance of a capacitor where the voltage conversion circuit is part of an amplifier circuit. As shown in FIG. 7, this amplifier circuit 100 comprises a voltage conversion circuit 101, coupling capacitor 102 and amplifier 103. An electric microphone 105 (microphone below) in which the capacitance of a capacitor is changed by sound waves is connected between ground GND and the input terminal IN of the amplifier circuit 100.

The capacitor of the microphone 105 is precharged, and the capacitance of the capacitor changes with the sound waves picked up by the microphone 105 thus causing the output voltage of the microphone 105 to vary according to the capacitance change. Note that the output voltage from the microphone 105 is applied to the input terminal IN of the amplifier circuit 100.

The voltage conversion circuit 101 voltage converts the voltage Vin input to the input terminal IN, and passes the converted voltage through coupling capacitor 102 to the amplifier 103. The amplifier 103 then outputs the amplified voltage from output terminal OUT. The voltage conversion circuit 101 uses a depletion type n-channel FET 111 and resistor 112 to voltage convert the voltage Vin input to the input terminal IN. The node between the gate and source of FET 111 is biased by the bias circuit of diodes 113 and 114, and the voltage Vgs between the gate and source of FET 111 fluctuates around 0 V. The drain current Id of the FET 111 is proportional to the square of pinchoff voltage Vp.

The relationship between pinchoff voltage Vp and the drain current Idss when the gate-source voltage Vgs is 0 V can be obtained from the following equation (a):

$$Idss=\beta \times Vp^2 \quad (a)$$

where $\beta$ is a coefficient determined by the gate size of the FET 111.

If the change in voltage Vin resulting from a change in the capacitance of the microphone 105 capacitor is $\Delta Vin$, then the change $\Delta Id$ in the drain current Id of FET 111 caused by $\Delta Vin$ when Vgs=0 can be obtained from the following equation (b).

$$\Delta Id=-2\times Idss\times \Delta Vin/Vp \quad (b)$$

The following equation (c) can therefore be derived from the above equations (a) and (b).

$$\Delta Id=-2\times \Delta Vin \times \beta \times Vp \quad (c)$$

Thus, if the resistance of resistor 112 is R, the change $\Delta Vr$ in voltage drop Vr due to resistor 112 when there is a $\Delta Id$ change in the drain current Id can be obtained from the following equation (d).

$$\Delta Vr=\Delta Id \times R=-2\times \Delta Vin \times \beta \times Vp \times R \quad (d)$$

If $R=Vp/(-2\times Idss)$, then we know from the above equations (b) and (d) that $\Delta Vr=\Delta Vin$.

With respect to the dc characteristics of the voltage conversion circuit 101, if Vx is the potential at point X, Vx will be the supply voltage Vdd minus the voltage drop of the resistor 112, and can be expressed as shown in equation (e) when current Idss flows to resistor 112.

$$Vx=Vdd-R\times Idss=Vdd-R\times \beta \times Vp^2 \quad (e)$$

When the amplifier circuit 100 is an IC device, however, variations during the manufacturing process produce variations in the pinchoff voltage Vp of FET 111. We know from equation (d) that the change $\Delta Vr$ in the voltage drop Vr varies in proportion to the pinchoff voltage Vp, and, as a result, from equation (e) that the potential Vx at point X varies.

Variations during the manufacturing process also produce variations in the absolute value of the resistance R of resistor 112, and we know from equation (d) that the change $\Delta Vr$ in the voltage drop Vr varies in proportion to this resistance R. Furthermore, resistance R and coefficient $\beta$ also have a temperature characteristic, which produces variation in potential Vx at point X.

A problem with the related art described above is therefore that a stable voltage gain and output voltage range cannot be obtained in the output voltage of the amplifier circuit 100.

In addition, the output voltage Vout from the output terminal OUT is easily saturated, and a large amplification factor cannot be achieved in the amplifier 103, due to variations in potential Vx at point X. It is therefore necessary for a coupling capacitor 102 to cut the dc component of the output voltage from the voltage conversion circuit 101, and then amplify by means of the amplifier 103. However, the output voltage from the voltage conversion circuit 101 cannot be dc amplified by the amplifier 103, and a high capacitance coupling capacitor 102 is required, making it difficult to integrate the amplifier circuit 100.

SUMMARY OF THE INVENTION

The present invention is therefore directed to a semiconductor integrated circuit comprising an electric microphone amplifier circuit for resolving the above problems, and more specifically to a semiconductor integrated circuit comprising an amplifier circuit that can be integrated into a semiconductor integrated circuit by using paired FETs formed in the same manufacturing process to limit the center of the dc characteristic of a voltage conversion circuit output voltage to ½ the supply voltage, and suppress variations in the output voltage due to various factors.

To achieve the above object, a semiconductor integrated circuit having an amplifier circuit for amplifying a voltage change accompanying a change in microphone capacitor capacitance comprises: a voltage conversion circuit for voltage converting this voltage change; an amplifier for amplifying a voltage converted by the voltage conversion circuit; and a reference bias circuit for producing and outputting a reference bias voltage to the amplifier. The voltage conversion circuit applies voltage conversion so that the midpoint of the voltage change is a value approximately ½ the dc voltage supplied to the amplifier.

In the dc characteristic of a voltage conversion circuit thus comprised, the output voltage of the voltage conversion circuit is ½ the dc supply voltage. The output signal from the voltage conversion circuit can therefore be amplified by the amplifier by direct coupling, and it is not necessary to provide a coupling capacitor. The amplifier and voltage conversion circuit can therefore be provided in the same chip, enabling easy integration and facilitating size reductions.

The voltage conversion circuit further preferably comprises a first FET for converting a voltage change to a drain current change, and a second FET for converting the drain current change of the first FET to a voltage. In this case, the first and second FETs are depletion type FETs formed in the same process.

By thus using a specific type of FET, variations in FET output voltage can be eliminated by eliminating variations in the manufacturing processes and temperature characteristics of the FETS. It should be noted that the gate length and gate width of the first and second FETs are preferably the same because variations in the manufacturing processes and temperature characteristics of the FETs can thus be more reliably eliminated, and variations in FET output voltage can be thereby eliminated.

The gate and source of the second FET are further preferably connected to the drain of the first FET. The same benefits can be achieved in this case.

Yet further preferably, bias circuits of the same configuration are connected between the gate and source of the first FET and the second FET. By thus using bias circuits of the same configuration, variations in the manufacturing processes and temperature characteristics of the FETs can thus be more reliably eliminated, and variations in FET output voltage can thereby be more reliably eliminated.

The voltage conversion circuit further preferably comprises a reference voltage generator for generating a specific reference voltage. This reference voltage generator outputs this reference voltage to the gate of the second FET, thereby eliminating variations in the manufacturing processes and temperature characteristics of the FETs, and eliminating output voltage variations.

The reference bias circuit preferably comprises a third FET of which the gate and source are connected to a common node, and a fourth FET series connected to the third FET with the gate and source thereof connected to a common node. The third and fourth FETs are also depletion type FETs formed in the same manufacturing process, and preferably voltage divide a dc supply voltage to generate and output a specific reference bias voltage.

By thus forming the reference bias circuit with a third FET having a commonly connected gate and source, a fourth FET series connected to the third FET and likewise having a commonly connected gate and source, and forming the third and fourth FETs in the same process, variations in the manufacturing processes and temperature characteristics of the FETs can thus be more reliably eliminated, and output voltage variations can thereby be more reliably eliminated.

Alternatively, the reference bias circuit preferably comprises a third FET having a bias circuit connected between the gate and source thereof, and a fourth FET series connected to the third FET and likewise having a bias circuit connected between the gate and source thereof. In this case, too, the third and fourth FETs are preferably depletion type FETs formed in the same manufacturing process, and voltage divide a dc supply voltage to generate and output a specific reference bias voltage.

By thus forming the reference bias circuit with series connected third and fourth FETs each having a bias circuit, which is identical to the bias circuit disposed to the first and second FETs, connected between the gate and source thereof, and both formed in the same process, variations in the manufacturing processes and temperature characteristics of the FETs can be even more reliably eliminated, and output voltage variations can be even more reliably eliminated.

Further alternatively, the reference bias circuit preferably comprises a third FET having a commonly connected gate and source, and a fourth FET series connected to the third FET and having a reference voltage generated by the reference voltage generator input to the gate thereof. In this case, too, the third and fourth FETs are preferably depletion type FETs formed in the same manufacturing process, and voltage divide a dc supply voltage to generate and output a specific reference bias voltage. Variations in the manufacturing processes and temperature characteristics of the FETs can thus be more reliably eliminated, and output voltage variations can thereby be more reliably eliminated.

Yet further preferably, the third FET is formed in the same process and shape as the first FET, and the fourth FET is formed in the same process and shape as the second FET. More specifically, the third FET and first FET are formed in the same process to have the same shape, and the fourth FET and second FET are formed in the same process to have the same shape. As a result, variations in the manufacturing processes and temperature characteristics of the FETs can be more reliably eliminated, and output voltage variations can thus be more reliably eliminated.

BRIEF DESCRIPTION OF THE DRAWINGS

Other objects and attainments together with a fuller understanding of the invention will become apparent and appreciated by referring to the following description and claims taken in conjunction with the accompanying drawings, in which like parts are designated by like reference numerals, and in which:

DETAILED DESCRIPTION OF THE PREFERRED EMBODIMENTS

Figure 1:
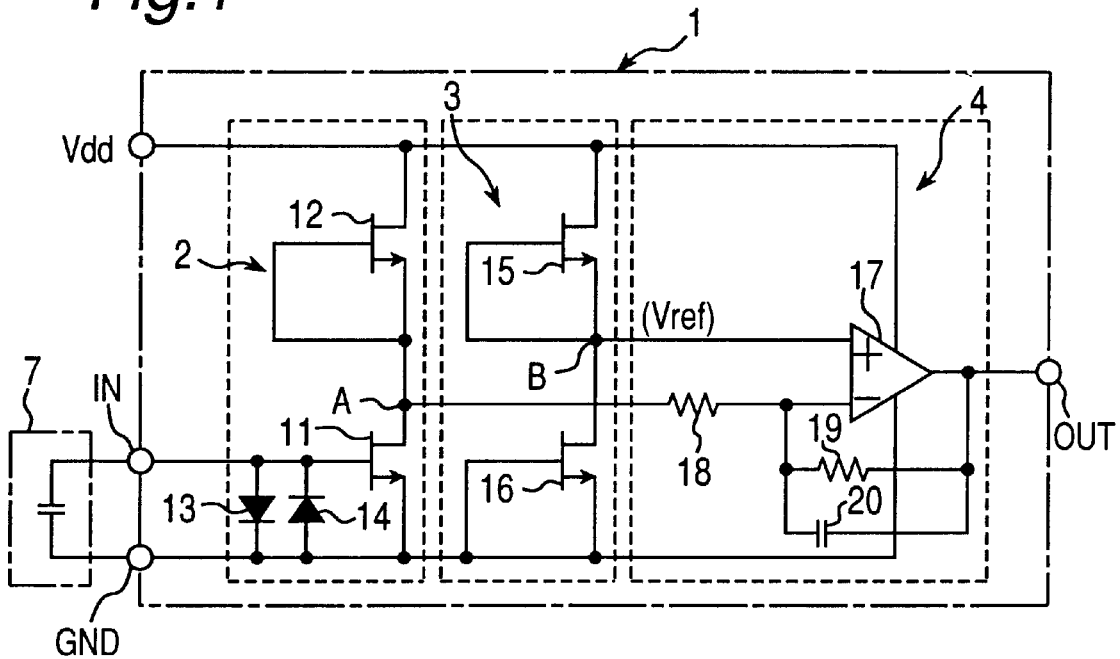
FIG. 1 is a circuit diagram of a semiconductor integrated circuit according to a first version of the first preferred embodiment of the present invention.

The preferred embodiments of the present invention are described below with reference to the accompanying figures.
First Embodiment FIG. 1 is a circuit diagram of a semiconductor integrated circuit according to a first version of the first preferred embodiment of the present invention. This preferred embodiment is shown in FIG. 1 using by way of example an amplifier circuit comprising a voltage conversion circuit for obtaining a voltage change induced by a change in the capacitance of a capacitor in an electric microphone. As shown in FIG. 1, this amplifier circuit 1 comprises a voltage conversion circuit 2, a reference bias circuit 3, and a dc amplifier 4.

The input terminal IN of the amplifier circuit is connected to the voltage conversion circuit 2. The output of the voltage conversion circuit 2 is connected to one input to the dc amplifier 4, and the output of the reference bias circuit 3 is connected to the other input to the dc amplifier 4. The output of the dc amplifier 4 is connected to the output terminal OUT of amplifier circuit 1. An electric microphone 7 (simply microphone below) in which the capacitance of a capacitor is changed by sound waves is connected between ground GND and the input terminal IN of the amplifier circuit 1.

The capacitor of the microphone 7 is precharged, and the capacitance of the capacitor changes with the sound waves picked up by the microphone 7, thus causing the output voltage of the microphone 7 to vary according to this capacitance change. Note that the output voltage from the microphone 7 is applied to the input terminal IN of the amplifier circuit 1 as input voltage Vin.

The voltage conversion circuit 2 voltage converts the voltage Vin input to the input terminal IN. The converted voltage is input to the dc amplifier 4, amplified, and output from the output terminal OUT. The reference bias circuit 3 generates and outputs reference bias voltage Vref to the dc amplifier 4 for use in voltage amplification.

More specifically, the voltage conversion circuit 2 voltage converts the voltage Vin input to the input terminal IN by means of n-channel FET 11 and FET 12, which are depletion type FETs manufactured in the same process and having the same characteristics. The gate of FET 11 is connected to input terminal IN; the gate and source are biased by diodes 13 and 14, which form a bias circuit; and the source goes to ground GND. Voltage Vgs between the gate and source of FET 11 thus fluctuates around 0 V. The drain of FET 12 is connected to power supply terminal Vdd, through which dc voltage Vdd is supplied from an external source. The gate and source of FET 12 are connected together, and connected to the drain of FET 11 at a node A.

The reference bias circuit 3 is likewise formed from two depletion type n-channel FETs 15 and 16. The gate and source of FET 15 are connected to a common node, and the gate and source of FET 16 are connected to a common node. The drain of FET 15 is connected to power supply terminal Vdd, and the gate-source node is connected to the drain of FET 16 at a node B. The gate-source node of FET 16 is connected to ground GND.

FETs 15 and 12 are manufactured in the same process to the same shape, and FETs 16 and 11 are manufactured in the same process to the same shape.

The dc amplifier 4 is a non-inverting amplifier comprising an operational amplifier (opamp) 17. Node A of the voltage conversion circuit 2 is connected to the inverting input of opamp 17 through a resistor 18, and node B of reference bias circuit 3 is connected to the non-inverting input of opamp 17. A parallel circuit of resistor 19 and capacitor 20 is connected between the output and inverting input of opamp 17, and the output of opamp 17 is connected to output terminal OUT.

The drain current Id of FET 11 is proportional to the square of pinchoff voltage Vp. As a result, the relationship between pinchoff voltage Vp and the drain current Idss when the gate-source voltage Vgs is 0 V can be obtained from the following equation (1):

$$Idss = \beta 1 \times Vp^2 \qquad (1)$$

where $\beta 1$ is a coefficient determined by the gate size of the FET 11.

Furthermore, let us assume that when there is a change $\Delta Vin$ in voltage Vin resulting from a change in the capacitance of the microphone 7 capacitor, voltage change $\Delta Vin$ is applied to the gate of FET 11, producing a change $\Delta Id$ in the drain current Id of FET 11. When the gate-source voltage Vgs=0 V, the change $\Delta Id$ in the drain current Id of FET 11 caused by voltage change $\Delta Vin$ can be obtained from the following equation (2).

$$\Delta Id = -2 \times Idss \times \Delta Vin / Vp \qquad (2)$$

The following equation (3) can therefore be derived from the above equations (1) and (2).

$$\Delta Id = -2 \times \Delta Vin \times \beta 1 \times Vp \qquad (3)$$

Note that because FET 12 and FET 11 are manufactured in the same process and have the same characteristics, the change in the drain current Id of FET 12 is the same as the change $\Delta Id$ in the drain current Id of FET 11. When the gate-source voltage Vgs=0 V, only drain current Id changes, and FET 12 operates as an on resistor. The value of on resistance R12 when gate-source voltage Vgs=0 V in FET 12 can be obtained from equation (4)

$$R12 = 1/(\beta 2 \times Vp) \qquad (4)$$

where $\beta 2$ is a coefficient determined by the gate size of the FET 12, and Vp is the pinchoff voltage of FET 12.

From the above equations (3) and (4), the voltage change $\Delta Vds$ in the drain-source voltage Vds of the FET 12 with respect to voltage change $\Delta Vin$ in the input voltage Vin can be derived as follows in equation (5).

$$\begin{aligned}\Delta Vds &= \Delta Id \times R12 \\ &= -2 \times \Delta Vin \times \beta 1 \times Vp / (\beta 2 \times Vp) \\ &= -2 \times \Delta Vin \times \beta 1 / \beta 2\end{aligned} \qquad (5)$$

We know from equation (5) that the value of the input voltage change $\Delta Vin$ to the change in the capacitance of the microphone capacitor after voltage conversion by the voltage conversion circuit 2 is determined by the ratio between coefficients $\beta 1$ and $\beta 2$ of FETs 11 and 12.

Therefore by forming the FET 11 and 12 pair in the same process to have the same shape and characteristics, variations in the manufacturing process and temperature characteristics are cancelled out, and variation in the potential at node A, that is, the output of voltage conversion circuit 2, can be suppressed.

Furthermore, with respect to the dc characteristic of the voltage conversion circuit 2, by assuring that $\beta 1$ and $\beta 2$ are the same, that is, the gate length and gate width of FET 11 and FET 12 are the same, the drain-source voltage is the same in FET 11 and FET 12. Therefore, if the potential at node A is Va, Va=Vdd/2. It is therefore obvious that the output voltage of voltage conversion circuit 2 fluctuates around Vdd/2.

Figure 2:
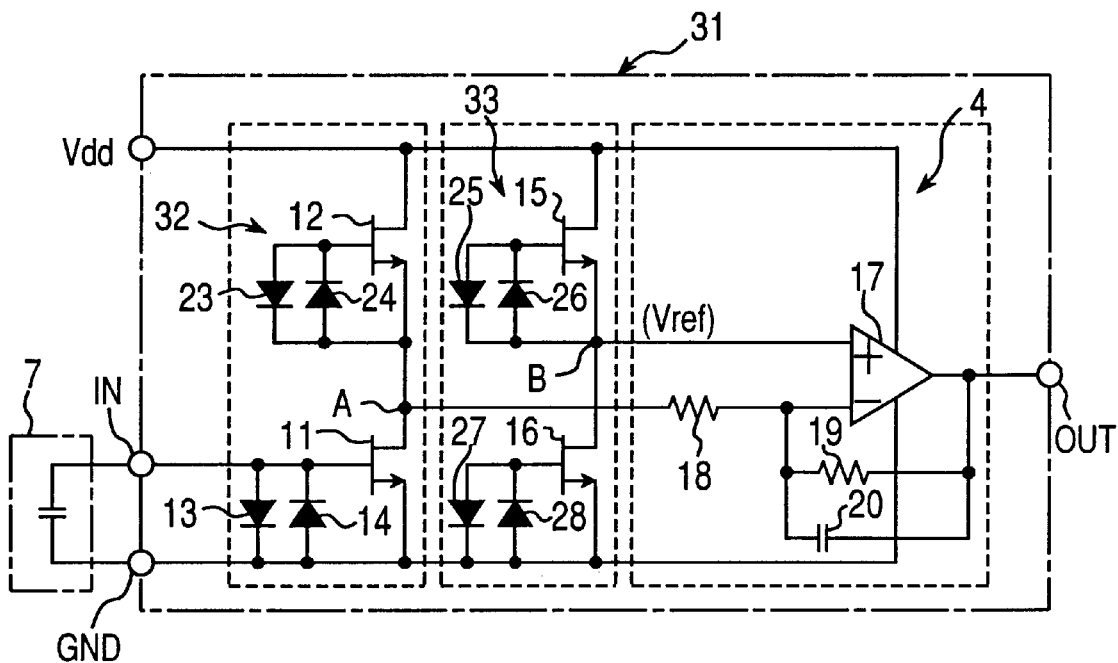
FIG. 2 is a circuit diagram of a semiconductor integrated circuit according to a second version of the first preferred embodiment of the present invention.

FIG. 2 is a circuit diagram of a further example of a semiconductor integrated circuit according to a first embodiment of the present invention. Note that this preferred embodiment is also shown in FIG. 2 using by way of example an amplifier circuit comprising a voltage conversion circuit for obtaining a voltage change induced by a change in the capacitance of a capacitor in An electric microphone.

This example differs from the version shown in FIG. 1 in that just as a bias circuit is connected between the gate and source of FET 11, the gate-source of FET 12 is likewise biased by diodes 23 and 24; the gate-source of FET 15 is biased by diodes 25 and 26; and the gate-source of FET 16 is biased by diodes 27 and 28.

As a result, wide variations in the output voltage of the voltage conversion circuit due to process variations can be more reliably prevented, and the precision of the reference bias circuit output voltage can be improved. It should be further noted that due to the addition of diodes 23 to 28 in FIG. 2, the voltage conversion circuit 2 in FIG. 1 is indicated as voltage conversion circuit 32, the reference bias circuit 3 as reference bias circuit 33, and the amplifier circuit 1 as amplifier circuit 31.

Furthermore, while FETs 11, 12, 15, and 16 in FIGS. 1 and 2 are described as n-channel depletion type FETs, the invention shall not be so limited, and it will be obvious that p-channel depletion type FETs can be alternatively used. In this case, the amplifier circuit 1 in FIG. 1 is indicated as amplifier circuit 1a in FIG. 3, the amplifier circuit 31 in FIG. 2 is indicated as amplifier circuit 31a in FIG. 4, and so forth.

Figure 3:
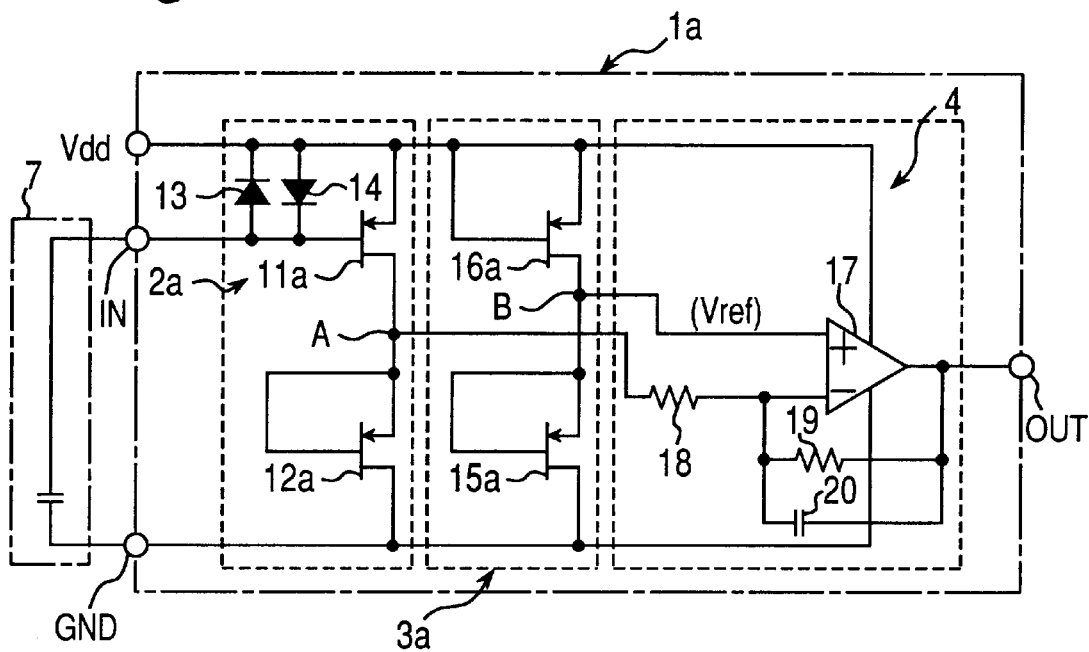
FIG. 3 is a circuit diagram of an alternative version of the first version of the first embodiment shown in FIG. 1.

Referring to FIG. 3, the voltage conversion circuit 2a comprises p-channel depletion type FETs 11a and 12a, and diodes 13 and 14. The reference bias circuit 3a comprises p-channel depletion type FETs 15a and 16a. The dc amplifier 4 is as shown in FIG. 1.

The gate of FET 11a is connected to input terminal IN; the source is connected to power supply terminal Vdd; the gate and source are biased by diodes 13 and 14, which form a bias circuit. FET 12a is formed in the same process as FET 11a. In FET 12a, the drain goes to ground GND; the gate and source are connected together, and connected to the drain of FET 11a at a node A.

Referring to FETs 15a and 16a, the gate and source of FET 15a are connected to a common node, and the gate and source of FET 16a are connected to a common node. The drain of FET 15a is to ground GND, and the gate-source node is connected to the drain of FET 16a at a node B. The gate and source of FET 16a are connected to a common node, which is connected to the supply terminal Vdd.

FETs 15a and 12a are manufactured in the same process to the same shape, and FETs 16a and 11a are manufactured in the same process to the same shape.

Note that the operating principle of the amplifier circuit 1a shown in FIG. 3 is the same as that of the amplifier circuit 1 shown in FIG. 1, and further description thereof is thus omitted below.

Figure 4:
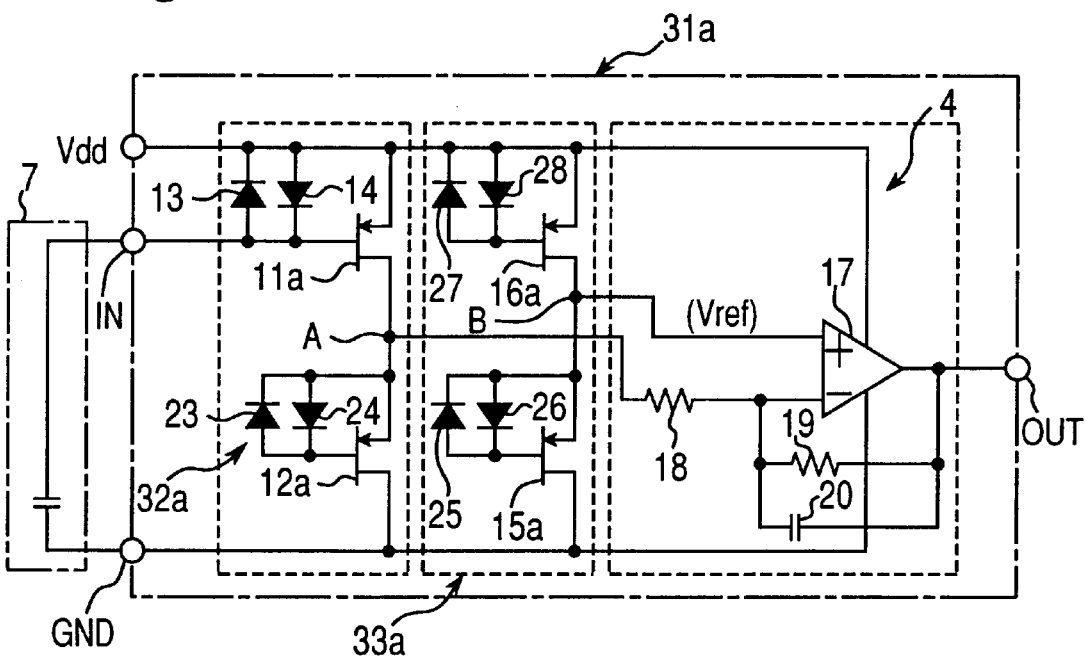
FIG. 4 is a circuit diagram of an alternative version of the second version of the first embodiment shown in FIG. 2.

The example shown in FIG. 4 differs from the version shown in FIG. 3 in that just as a bias circuit is connected between the gate and source of FET 11a, the gate-source of FET 12a is likewise biased by diodes 23 and 24; the gate-source of FET 15a is biased by diodes 25 and 26; and the gate-source of FET 16a is biased by diodes 27 and 28. The operating principle of the amplifier circuits shown in FIG. 4 and FIG. 2 is the same, and further description thereof is thus omitted below.

As will be known from the above description, when the voltage conversion circuit of a semiconductor integrated circuit according to this first embodiment of the present invention voltage converts an input voltage change ΔVin resulting from a change in the capacitance of a microphone capacitor, this voltage conversion is accomplished using a pair of depletion FETs formed to the same shape and characteristics in the same manufacturing process. As a result, the dc characteristic of the voltage conversion circuit is noted by the output voltage Va of the voltage conversion circuit fluctuating around Vdd/2.

It is therefore possible to eliminate variations in the manufacturing processes and temperature characteristics of the FETs, and thereby eliminate variation in the output voltage.

In addition, the output signal from the voltage conversion circuit can be amplified in the dc amplifier 4 by dc coupling. It is therefore not necessary to provide a coupling capacitor, and the amplifier circuit can be formed on the same chip as the voltage conversion circuit, thereby facilitating integration and size reduction.

Second Embodiment

Figure 5:
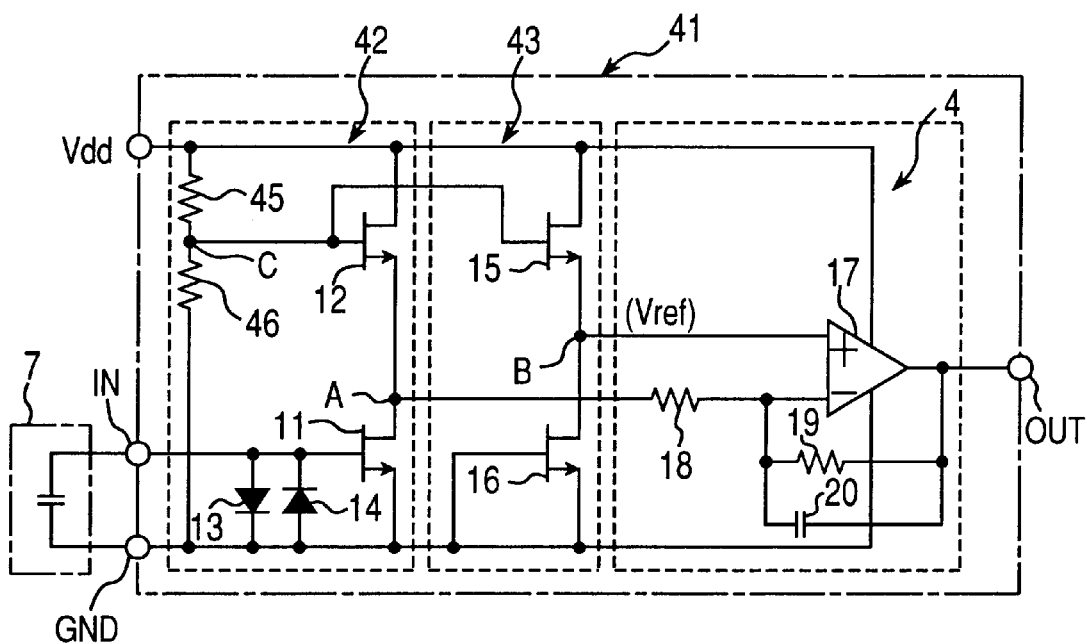
FIG. 5 is a circuit diagram of a semiconductor integrated circuit according to a second preferred embodiment of the present invention.

FIG. 5 is a circuit diagram of a semiconductor integrated circuit according to a second preferred embodiment of the present invention. Note that this preferred embodiment is also shown using by way of example an amplifier circuit comprising a voltage conversion circuit for obtaining a voltage change induced by a change in the capacitance of a capacitor in a microphone.

The amplifier circuit shown in FIG. 5 differs from that in FIG. 1 in the addition of two resistors 45 and 46 for voltage dividing supply voltage Vdd to the voltage conversion circuit 2, and applying the voltage divided output of resistors 45 and 46 to the gates of FET 12 and FET 15. The voltage conversion circuit 2 shown in FIG. 1 is therefore referred to as voltage conversion circuit 42, the reference bias circuit 3 as reference bias circuit 43, and the amplifier circuit 1 as amplifier circuit 41.

As shown in FIG. 5, this amplifier circuit 41 comprises a voltage conversion circuit 42, a reference bias circuit 43, and a dc amplifier 4.

The input terminal IN of the amplifier circuit 41 is connected to the voltage conversion circuit 42. The output of the voltage conversion circuit 42 is connected to one input to the dc amplifier 4, and the output of the reference bias circuit 43 is connected to the other input to the dc amplifier 4.

The voltage conversion circuit 42 voltage converts the voltage Vin input to the input terminal IN. The converted voltage is input to the dc amplifier 4, amplified, and output from the output terminal OUT. The reference bias circuit 43 generates and outputs reference bias voltage Vref to the dc amplifier 4 for use in voltage amplification.

The voltage conversion circuit 42 comprises FETs 11 and 12, diodes 13 and 14, resistors 45 and 46, and voltage converts the voltage Vin input to the input terminal IN by means of n-channel depletion type FET 11 and FET 12. The resistors 45 and 46 are connected in series, and this series circuit is connected between supply terminal Vdd and ground GND. The drain of FET 12 is connected to supply terminal Vdd, the gate to a node C between resistor 45 and resistor 46, and the source is connected to the drain of FET 11 at node A.

The reference bias circuit 43 comprises two FETs 15 and 16 as described above. The drain of FET 15 is connected to power supply terminal Vdd, the gate is connected to node C between resistors 45 and 46, and the source is connected to the drain of FET 16 at node B. The gate and source of FET 16 are connected to a common node, which goes to ground GND.

In an amplifier circuit 41 thus comprised, the change ΔId in the drain current Id of FET 11 caused by voltage change ΔVin when the gate-source voltage Vgs=0 V can be obtained from the above equation (3). The change in the drain current Id of FET 12 is the same as the change ΔId in the drain current Id of FET 11.

In FET 12, the gate voltage is the voltage Vc of node C, and the gate-source voltage Vgs varies according to the change in the drain current Id. If this change is ΔVgs, the change ΔId in the drain current Id of FET 12 can be obtained from the following equation (6).

$$\Delta Id = -2 \times \Delta Vgs \times \beta 2 \times Vp \qquad (6)$$

The voltage change ΔVgs in the gate-source voltage Vgs of FET 12 due to voltage change ΔVin in the input voltage Vin can therefore be derived from equations (3) and (6) as shown in equation (7).

$$\Delta Vgs = (\beta 1/\beta 2) \times \Delta Vin \qquad (7)$$

Because change ΔVa in voltage Va of node A is equal to the voltage change ΔVgs in the gate-source voltage Vgs of FET 12, it is also known that from equation (7) that the value of the input voltage change ΔVin to the change in the capacitance of the microphone capacitor after voltage conversion by the voltage conversion circuit 2 is determined by the ratio between coefficients β1 and β2 of FETs 11 and 12.

Therefore by forming the FET 11 and 12 pair in the same process to have the same shape and characteristics, variations in the manufacturing process and temperature characteristics are cancelled out, and variation in the potential at node A, that is, the output of voltage conversion circuit 42, can be suppressed.

Regarding the dc characteristic of the voltage conversion circuit 42, voltage Va of node A can be obtained from equation (8)

$$Va = Vc - Vgs \qquad (8)$$

where Vc is the voltage of node C.

Equation (8) teaches that by assuring that the resistance of resistors 45 and 46 is equal so that Vc=Vdd/2, and that β1 and β2 are the same, that is, the gate length and gate width of FET 11 and FET 12 are the same, Vgs=0 and Va=Vdd/2. As a result, the output voltage of voltage conversion circuit 42 fluctuates around Vdd/2.

As also noted above, while FETs 11, 12, 15, and 16 in FIG. 5 are described as n-channel depletion type FETs, the invention shall not be so limited, and it will be obvious that p-channel depletion type FETs can be alternatively used. In this case, the amplifier circuit 41 in FIG. 5 is indicated as amplifier circuit 41a in FIG. 6, and so forth. Like parts are also indicated by like reference numerals in FIG. 5 and FIG. 6, and further description thereof is thus omitted below.

Figure 6:
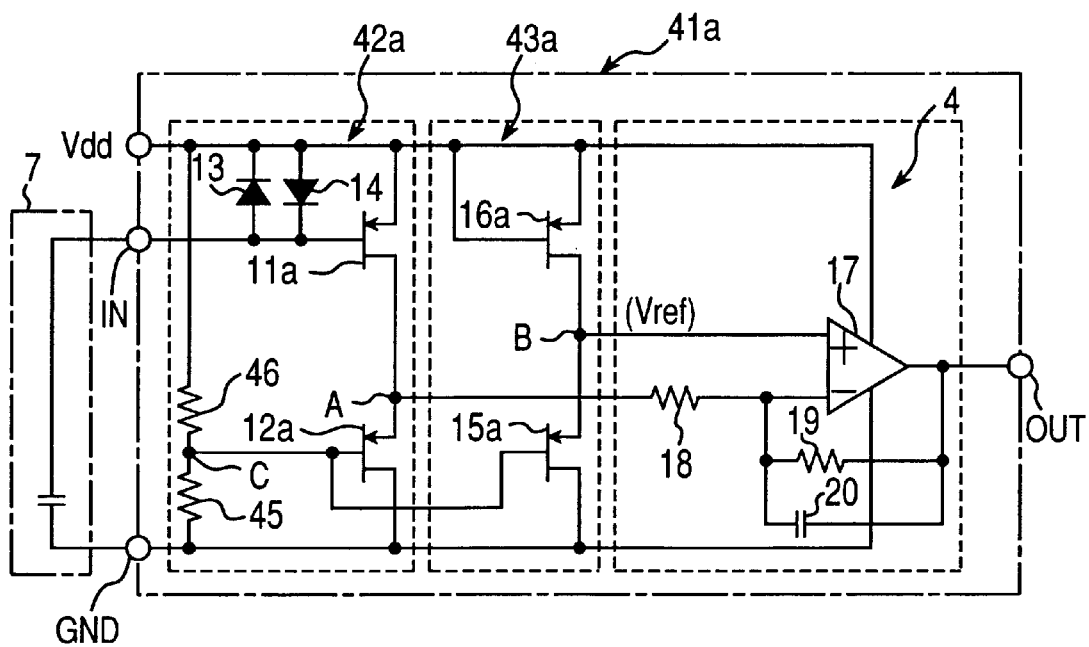
FIG. 6 is a circuit diagram of an alternative version of the second embodiment shown in FIG. 5.
Figure 7:
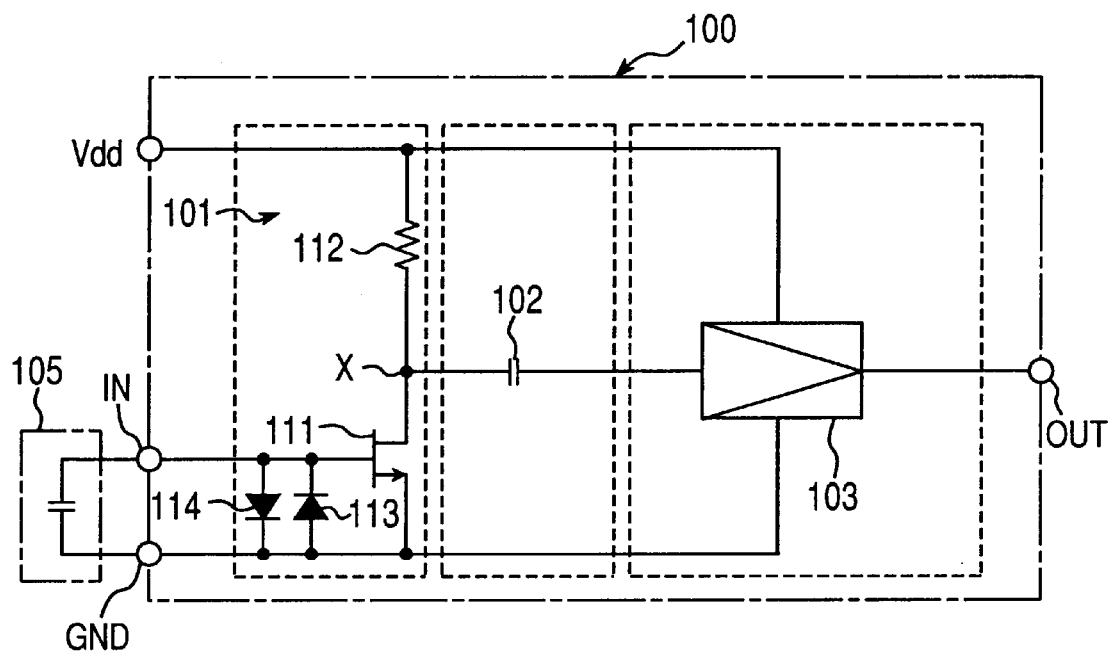
FIG. 7 is a circuit diagram of a voltage conversion circuit for obtaining a voltage variation caused by a change in capacitor capacitance according to a prior art.

Referring to FIG. 6, the voltage conversion circuit 42a comprises p-channel depletion type FETs 11a and 12a, and diodes 13 and 14. The reference bias circuit 43a comprises p-channel depletion type FETs 15a and 16a.

The gate of FET 11a is connected to input terminal IN; the source is connected to power supply terminal Vdd; the gate and source are biased by diodes 13 and 14, which form a bias circuit. In FET 12a, the drain goes to ground GND; the gate is connected to node C between resistors 45 and 46; and the source is connected to the drain of FET 11a at node A.

The drain of FET 15a is to ground GND, the gate is connected to node C between resistors 45 and 46, and the source is connected to the drain of FET 16a at node B. The gate and source of FET 16a are connected to a common node, and from this node to supply terminal Vdd.

Note that the operating principle of the amplifier circuits shown in FIG. 5 and FIG. 6 is the same, and further description thereof is thus omitted below.

As will be known from the above description, when the voltage conversion circuit of a semiconductor integrated circuit according to this second embodiment of the present invention voltage converts an input voltage change ΔVin resulting from a change in the capacitance of a microphone capacitor, this voltage conversion is accomplished using a pair of depletion FETs formed to the same shape and characteristics in the same manufacturing process. As a result, the dc characteristic of the voltage conversion circuit is noted by the output voltage Va of the voltage conversion circuit fluctuating around Vdd/2. The benefits and effects of this second embodiment are therefore the same as those of the first embodiment described above, and further description thereof is thus omitted below.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor integrated circuit for amplifying an output voltage of an electric microphone, said output voltage changing in accordance with a change in a capacitance of a capacitor contained in said electret microphone, comprising:

a voltage conversion circuit configured to voltage-convert the output voltage of the electret microphone to produce a voltage converted output so that a midpoint of a change in the output voltage is a predetermined value;

an amplifier supplied with a DC voltage twice the predetermined voltage and configured to amplify the voltage converted output; and a reference bias circuit configured to produce and output a reference bias voltage to said amplifier;

wherein said voltage conversion circuit comprises:

a first FET configured to convert a voltage change to a drain current change, a second FET configured to convert the drain current change of the first FET to a voltage, and the first and second FETs are depletion type FETs belonging to a same manufacture lot.

2. A semiconductor integrated circuit according to claim 1, wherein the gate length and gate width of the first and second FETs are the same.

3. A semiconductor integrated circuit according to claim 1, wherein the gate and source of the second FET are connected to the drain of the first FET.

4. A semiconductor integrated circuit according to claim 1, wherein a bias circuit is connected between the gate and source of the first FET, and a bias circuit of the same configuration is connected between the gate and source of the second FET.

5. A semiconductor integrated circuit according to claim 1, wherein the voltage conversion circuit comprises a reference voltage generating circuit for generating a specific reference voltage, and the reference voltage generating circuit outputs this reference voltage to the gate of the second FET.

6. A semiconductor integrated circuit according to claim 3, wherein the reference bias circuit comprises:

a third FET of which the gate and source are connected together, and a fourth FET of which the gate and source are connected together, and which is series connected to the third FET;

wherein the third and fourth FETs are depletion type FETs belonging to a same manufacture lot, and divide the DC supply voltage to generate and output a specific reference bias voltage.

7. A semiconductor integrated circuit according to claim 4, wherein the reference bias circuit comprises:
a third FET having a bias circuit connected between the gate and source thereof, and
a fourth FET having a bias circuit connected between the gate and source thereof, and being series connected to the third FET;
wherein the third and fourth FETs are depletion type FETs belonging to a same manufacture lot, and divide the DC supply voltage to generate and output a specific reference bias voltage.

8. A semiconductor integrated circuit according to claim 5, wherein the reference bias circuit comprises:
a third FET having a commonly connected gate and source, and
a fourth FET series connected to the third FET and having a reference voltage generated by the reference voltage generating circuit input to the gate thereof;
wherein the third and fourth FETs are depletion type FETs belonging to a same manufacture lot, and divide the DC supply voltage to generate and output a specific reference bias voltage.

9. A semiconductor integrated circuit according to claim 6, wherein the third FET and first FET belong to a same manufacture lot to have an identical shape, and the fourth FET and second FET belong to a same manufacture lot to have an identical shape.

* * * * *

UNITED STATES PATENT AND TRADEMARK OFFICE
CERTIFICATE OF CORRECTION

PATENT NO. : 6,218,883 B1
DATED : April 17, 2001
INVENTOR(S) : Takanobu Takeuchi It is certified that error appears in the above-identified patent and that said Letters Patent is hereby corrected as shown below:

<u>Title page,</u>
Item [54], column 1, the Title of Invention is incorrect, item [54] should read as follows:

-- [54] SEMICONDUCTOR INTEGRATED CIRCUIT FOR ELECTRET MICROPHONE --

Signed and Sealed this

Sixteenth Day of October, 2001

*Attest:*

NICHOLAS P. GODICI
*Attesting Officer*    *Acting Director of the United States Patent and Trademark Office*